United States Patent
Miks

(10) Patent No.: US 7,293,716 B1
(45) Date of Patent: Nov. 13, 2007

(54) SECURE DIGITAL MEMORY CARD USING LAND GRID ARRAY STRUCTURE

(75) Inventor: Jeffrey Alan Miks, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 263 days.

(21) Appl. No.: 11/120,087

(22) Filed: May 2, 2005

Related U.S. Application Data

(63) Continuation-in-part of application No. 11/060,264, filed on Feb. 17, 2005, now Pat. No. 7,112,875.

(51) Int. Cl.
*G06K 19/06* (2006.01)

(52) U.S. Cl. .................. 235/492; 235/451; 257/679

(58) Field of Classification Search ............... 235/441, 235/436, 439, 451; 257/679
See application file for complete search history.

(56) References Cited

U.S. PATENT DOCUMENTS

| | | | |
|---|---|---|---|
| 3,668,299 A | 6/1972 | McNeal | |
| 4,532,419 A | 7/1985 | Takeda | |
| 4,905,124 A | 2/1990 | Banjo et al. | |
| 4,974,120 A | 11/1990 | Kodai et al. | |
| 5,172,214 A | 12/1992 | Casto | |
| 5,360,992 A | 11/1994 | Lowrey et al. | |
| 5,574,309 A | 11/1996 | Papaietro et al. | |
| 5,742,479 A | 4/1998 | Asakura | |
| 5,753,532 A | 5/1998 | Sim | |
| 5,784,259 A | 7/1998 | Asakura | |
| 5,789,280 A | 8/1998 | Yokota et al. | |
| 5,808,359 A | 9/1998 | Muto et al. | |
| 5,822,190 A | 10/1998 | Iwasaki | |
| 5,893,724 A | 4/1999 | Chakravorty et al. | |
| 5,977,613 A | 11/1999 | Takata et al. | |
| 6,040,622 A | 3/2000 | Wallace | |
| 6,143,981 A | 11/2000 | Glenn | |
| D445,096 S | 7/2001 | Wallace | |
| D446,525 S | 8/2001 | Okamoto et al. | |
| 6,376,283 B1 | 4/2002 | Chen | |
| 6,384,472 B1 | 5/2002 | Huang | |
| 6,462,273 B1 | 10/2002 | Corisis et al. | |
| 6,476,331 B1 * | 11/2002 | Kim et al. | .................. 174/261 |
| 6,476,469 B2 | 11/2002 | Hung et al. | |
| 6,545,332 B2 | 4/2003 | Huang | |
| 6,603,196 B2 | 8/2003 | Lee et al. | |

(Continued)

FOREIGN PATENT DOCUMENTS

JP      7017175      1/1995

(Continued)

*Primary Examiner*—Seung Ho Lee
(74) *Attorney, Agent, or Firm*—Stetina Brunda Garred & Brucker

(57) ABSTRACT

A memory card comprising a substrate which has a plurality of contacts and a plurality of metal features. The contacts and the metal features are disposed in spaced relation to each other and each define opposed first and second surfaces. Mounted to the substrate is at least one electronic component which is electrically connected thereto. A body covers the electronic component and at least portions of the contacts and the metal features such that the second surfaces of the contacts and the metal features are exposed in a common exterior surface of the body.

20 Claims, 4 Drawing Sheets

U.S. PATENT DOCUMENTS

| | | |
|---|---|---|
| 6,624,005 B1 | 9/2003 | DiCaprio et al. |
| 2002/0140068 A1 | 10/2002 | Lee |
| 2002/0195500 A1* | 12/2002 | Maruyama ................ 235/492 |

FOREIGN PATENT DOCUMENTS

| | | |
|---|---|---|
| JP | 3112688 | 12/1995 |
| JP | 8190615 | 7/1996 |
| JP | 10334205 | 12/1998 |
| KR | 199410938 | 5/1994 |
| KR | 199552621 | 12/1995 |

* cited by examiner

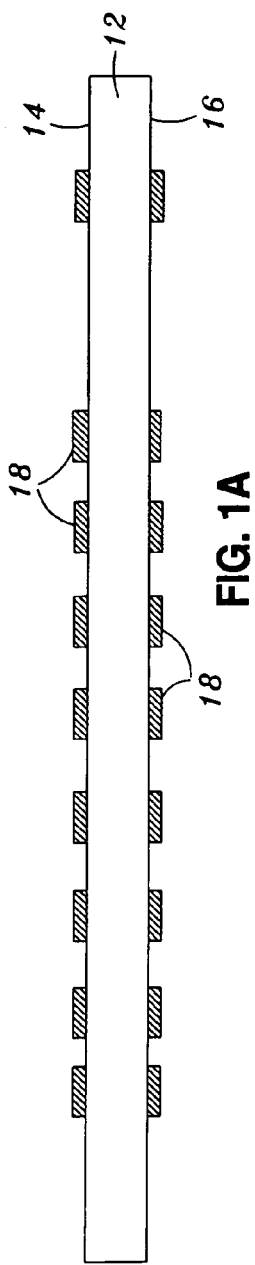
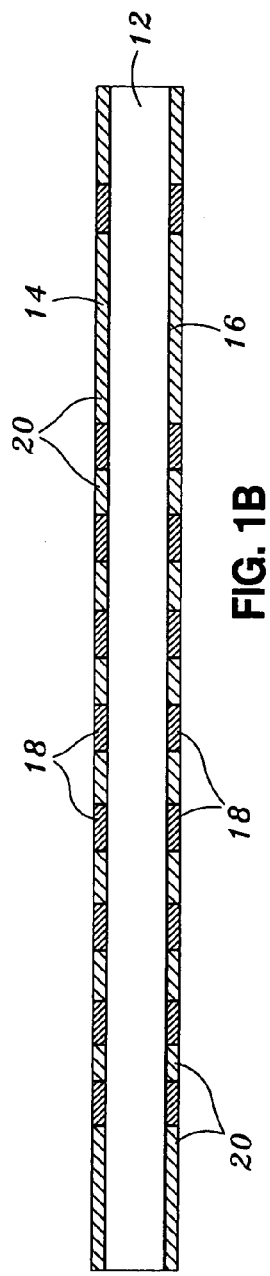
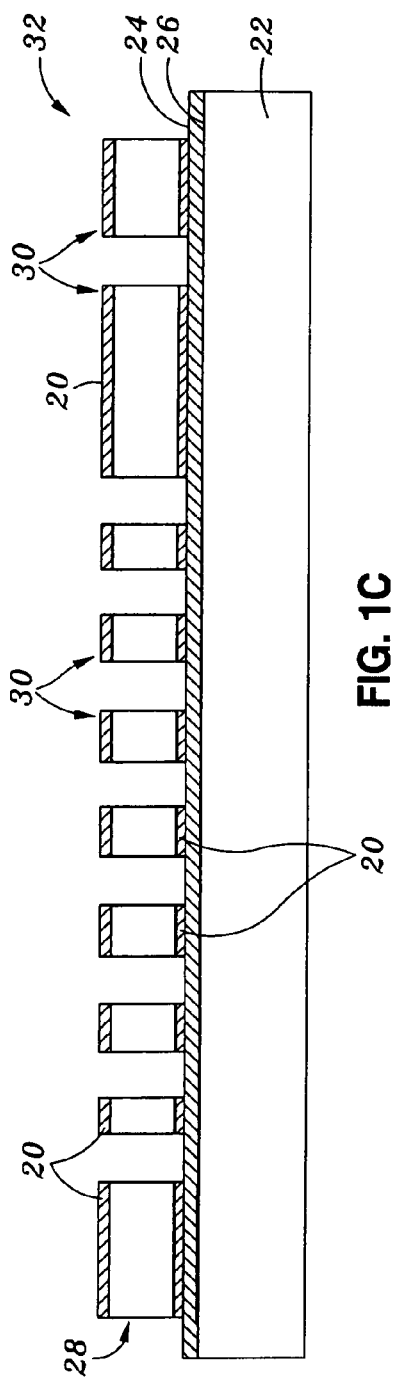
FIG. 1A
FIG. 1B
FIG. 1C

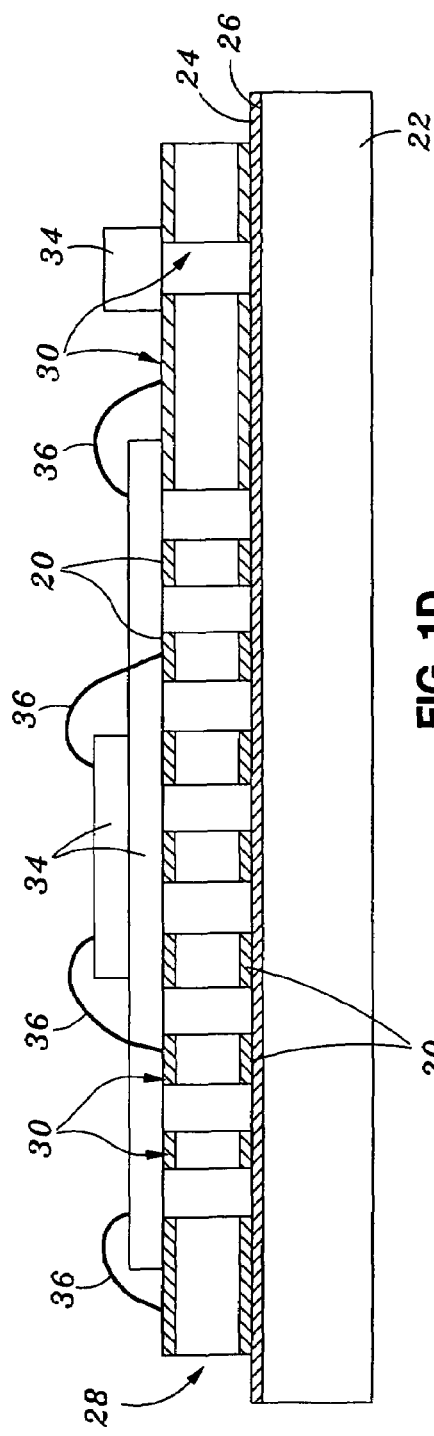
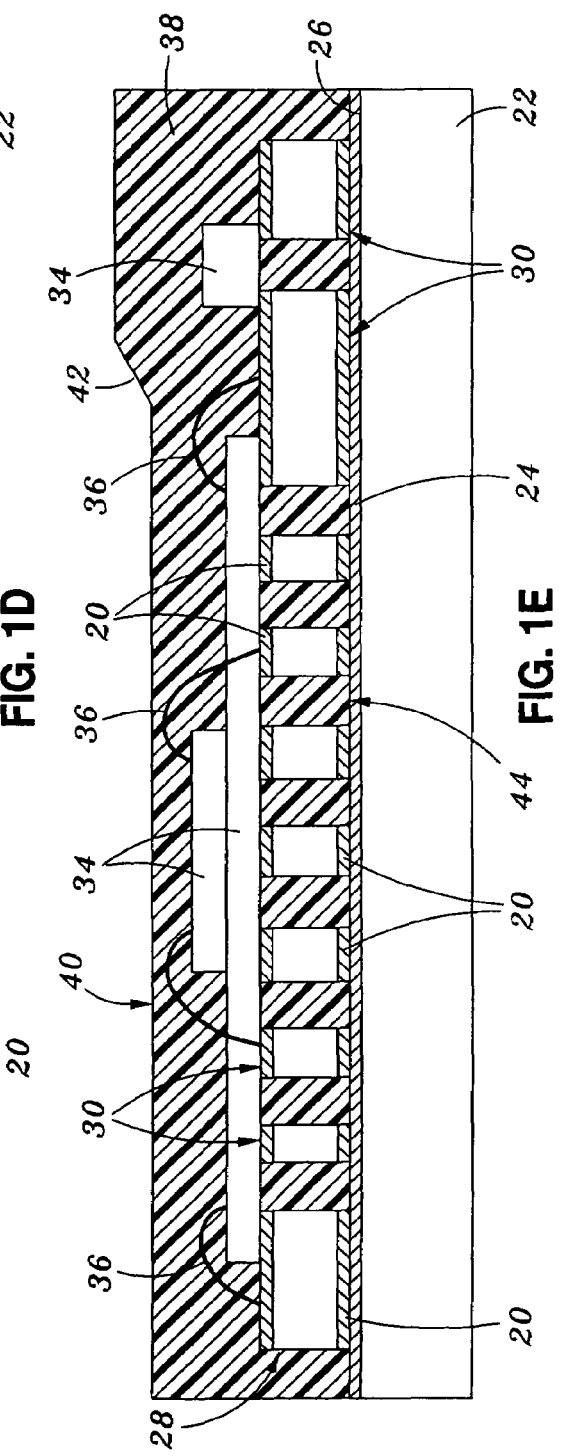
FIG. 1D
FIG. 1E

SECURE DIGITAL MEMORY CARD USING LAND GRID ARRAY STRUCTURE

CROSS-REFERENCE TO RELATED APPLICATIONS

The present application is a continuation-in-part of U.S. application Ser. No. 11/060,264 entitled SECURE DIGITAL MEMORY CARD USING LAND GRID ARRAY STRUCTURE filed Feb. 17, 2005 now U.S. Pat. No. 7,112,875, the disclosure of which is incorporated herein by reference.

STATEMENT RE: FEDERALLY SPONSORED RESEARCH/DEVELOPMENT

Not Applicable

BACKGROUND OF THE INVENTION

The present invention relates generally to memory cards, and more particularly, to a memory card (e.g., a secure digital card (SDC)) which includes a land grid array (LGA) structure and is fabricated such that the external signal contacts (ESC's) are located on or about the same plane as the bottom side or surface of the memory card, and the exposed tie bars which are typical artifacts of traditional leadframe based memory cards are eliminated without compromising routability between the components.

As is well known in the electronics industry, memory cards are being used in increasing numbers to provide memory storage and other electronic functions for devices such as digital cameras, MP3 players, cellular phones, and Personal Digital Assistants. In this regard, memory cards are provided in various formats, including multi-media cards and secure digital cards.

Typically, memory cards include multiple electronic components such as integrated circuit devices, semiconductor dies, passive components, and the like. The components are often interconnected using a circuit board substrate which can accommodate complex routing. Memory cards also include electrical contacts or terminals for providing an external interface to an insertion point or socket. These electrical contacts are typically disposed on one side or face of the circuit board substrate, with the electrical connection to the components mounted to the substrate being provided by conductive vias and traces which extend through and along the substrate.

In certain memory cards, a leadframe assembly is used as an alternative to the circuit board substrate, as is described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001.

In those memory card configurations which in employ the use of the above-described substrate having one or more electrical devices or components mounted thereto, such components are typically covered or protected by a cap or lid (sometimes referred to as a "skin") which is separately fabricated and attached to the substrate. The cap is typically fabricated through the implementation of an injection molding process, and is subsequently adhesively secured to the substrate in a manner covering or shielding the components mounted thereto. The cap is typically fabricated such that when mounted to the substrate, the resultant memory card meets or achieves a desired "form factor." As will be recognized, the requirement of separately fabricating the cap and thereafter carrying out a separate process or step to mechanically couple the cap to the substrate increases the manufacturing cost for the prior art memory card, in addition to decreasing yield rate. This separate coupling process also increases the susceptibility of the internal components mounted to the substrate of being contaminated with various particles.

In addition to the foregoing, memory cards, such as secure digital cards, are used by advancing the same into a host socket which includes a plurality of connector pins. Many host sockets include a number of connector pins sufficient to accommodate the contacts included in various memory card formats. Though leadframe based memory cards possess certain advantages over circuit board based cards, one of the drawbacks associated with leadframe based memory cards is that portions of the tie bars which are used to connect the contacts and/or die pad(s) of the leadframe to the outer frame thereof are typically exposed in the leading edge and remaining side edges of the memory card. More particularly, exposed within the leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential to short against the metal features of the host socket, and are thus highly undesirable. Another limitation of the leadframe based memory card is routability. Leadframe based memory cards cannot accommodate complex component interconnections.

The present invention addresses and overcomes the aforementioned deficiencies of currently known memory cards, and will be described in more detail below.

BRIEF SUMMARY OF THE INVENTION

In accordance with the present invention, there is provided a memory card which includes a land grid array (LGA) structure and is fabricated such that the external signal contacts (ESC's) are located on or about the same plane as the bottom side or surface of the memory card, and the exposed tie bars which are typical artifacts of traditional leadframe based memory cards are eliminated. The molding process used in the fabrication of the memory card of the present invention also effectively eliminates the need for the separate cap or lid of prior art memory cards, and provides a molded memory card with the desirable look of a lidded memory card. Further, the land grid array structure in the present memory card provides signal routing capability similar to that of a laminate substrate of a conventional memory card, but provides many of the cost/manufacturing economies of currently known leadframe based memory cards. In addition to eliminating the exposed tie bars and providing more complex signal routing that is required for die stack applications, the land grid array structure of the present memory card provides metal features (e.g., traces, die pads, test points/pads, etc.) which are exposed in the card body and used for interconnects between at least one semiconductor die and SMT (surface mount technology) components. These metal features are ultimately covered by a non-conductive label/ink applied to the card body.

The elimination of the separate cap or lid in the present memory card lowers manufacturing costs while increasing yield rate. Moreover, the completed memory card is devoid of any exposed metal features other than for the external signal contacts thereof. Further, as indicated above, the land grid array substrate in the present memory card provides signal routing capability similar to that of a laminate substrate of a conventional memory card, but provides many of the cost/manufacturing economies of currently known leadframe based memory cards. Thus, the memory card of the present invention possesses the most desirable attributes of both laminate based, lidded memory cards and leadframe based, molded memory cards.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIGS. 1A-1E illustrate an exemplary sequence of steps which may be used to facilitate the fabrication of a memory card constructed in accordance with the present invention;

Common reference numerals are used throughout the drawings and detailed description to indicate like elements.

DETAILED DESCRIPTION OF THE INVENTION

Figure 4:
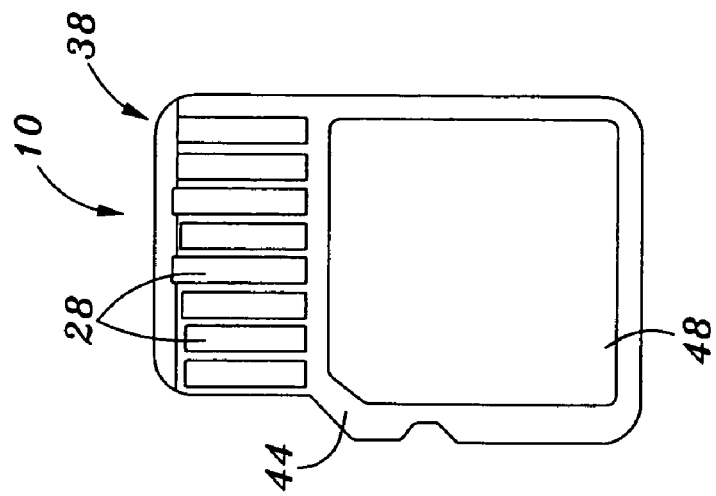
FIG. 4 is a bottom plan view of the memory card subsequent to the application of a label to the card body thereof.
Figure 5:
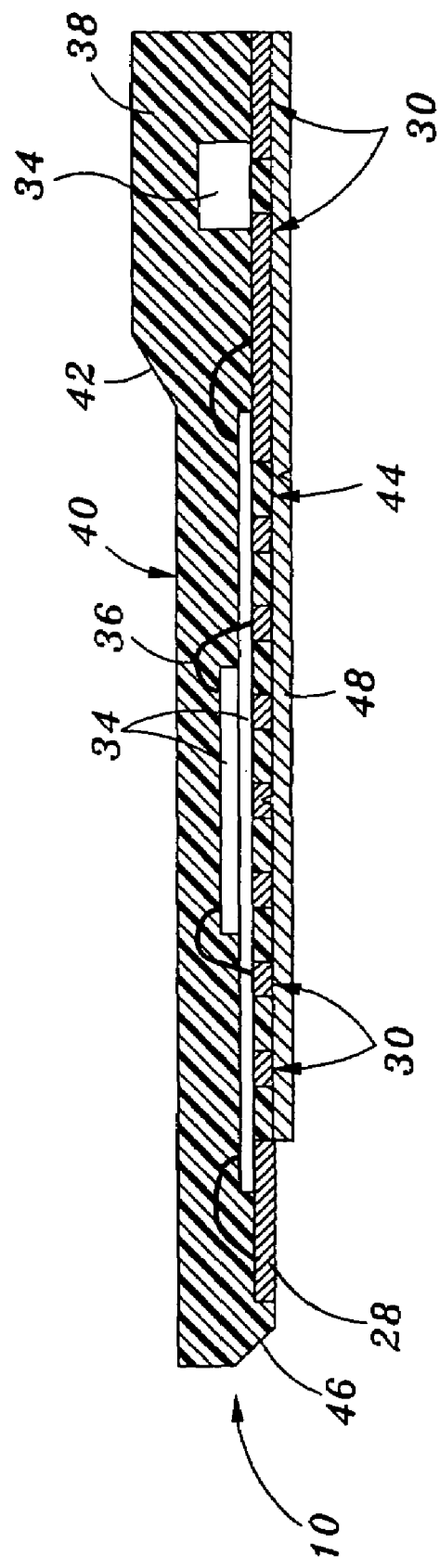
FIG. 5 is a cross-sectional view of the memory card shown in FIG. 4.

Referring now to the drawings wherein the showings are for purposes of illustrating preferred embodiments of the present invention only, and not for purposes of limiting the same, FIGS. 1A-1E illustrate an exemplary sequence of steps which may be used to facilitate the formation of a memory card 10 which is constructed in accordance with the present invention and shown in its completed state in FIGS. 4 and 5. Those of ordinary skill in the art will recognize that the fabrication process which will be described below, though applicable to fabricate one memory card 10 at a time, is typically implemented on a scale wherein multiple memory cards 10 are simultaneously fabricated using a common carrier/substrate. As shown in FIG. 1A, in the initial step of the fabrication process for the memory card 10, a layer or sheet 12 of a conductive metal material (e.g., copper) is provided, the sheet 12 defining a generally planar first (top) surface 14 and an opposed, generally planar second (bottom) surface 16. A plating mask 18 is applied to prescribed portions or areas of the first and second surfaces 14, 16 of the sheet 12.

Referring now to FIG. 1B, subsequent to the application of the plating mask 18 to the sheet 12 in the above-described manner, a plating layer 20 is applied to those areas of the first and second surfaces 14, 16 which are not covered by the plating mask 18. Each plating layer 20 is preferably fabricated from a conductive metal material such as silver, nickel, and/or gold (but not necessarily limited to these metals). Upon the complete formation of each plating layer 20, the plating mask 18 is removed from the sheet 12.

Referring now to FIG. 1C, upon the removal of the plating mask 18 therefrom, the sheet 12 including the plating layers 20 is mounted to a carrier 22 which is typically fabricated from a metal material (e.g., copper). More particularly, the plating layer 20 formed on the second surface 16 of the sheet 12 is adhered to a tape layer 24 which is itself applied to a first surface 26 of the carrier 22. Thereafter, an etching process is completed wherein a chemical etchant is applied to those areas of the first surface 14 of the sheet 12 from which the plating mask 18 was previously removed, i.e., those areas of the first surface 14 not covered by a plating layer 20. This etching process results in the removal of those portions of the sheet 12 which are located between the aligned areas of the first and second surfaces 14, 16 of the sheet 12 exposed as a result of the removal of the plating mask 18. Thus, as seen in FIG. 1C, the sheet 12 is effectively divided or segregated into a number of separate and distinct parts, including a plurality of contacts 28 and a plurality of metal features 30 (e.g., conductive traces, die pads, test points/pads, etc.). The contacts 28 and metal features 30 collectively define a completed land grid array substrate 32 of the memory card 10.

In the completed substrate 32, the contacts 28 and metal features 30 each include a pair of the plating layers 20 which are disposed on respective ones of opposed sides or faces thereof. Those of ordinary skill in the art will recognize that the configuration of the substrate 32 as shown in FIG. 1C is exemplary only in that the metal features 30 may be provided in fewer or greater numbers and/or in configurations differing from those depicted. Further, the particular pattern or arrangement of the metal features 30 included in the substrate 32 may be varied from the pattern shown. Advantageously, as indicated above, the above-described process for forming the substrate 32 allows for the formation of the metal features 30 in a manner providing signal routing capabilities similar to that of a laminate substrate of a conventional memory card.

Referring now to FIG. 1D, after the substrate 32 has been fully formed, various electronic components 34 are mounted to the exposed surface of the plating layer 20 of one or more of the metal features 30. The electronic components 34 may further be attached to the exposed surface of the plating layer 20 of one or more of the contacts 28. The electronic components 34 may comprise semiconductor packages, semiconductor dies, passive components or other devices, and may be provided in any combination. Though, in FIG. 1D, a stacked pair of electronic components 34 (e.g., semiconductor dies) is shown as being attached to the exposed plating layers 20 of at least some of the contacts 28 and metal features 30 and another electronic component 34 (e.g., an SMT component) is shown as being attached to the exposed plating layers 20 of an adjacent pair of metal features 30, those of ordinary skill in the art will recognize that the number and arrangement of electronic components 34 depicted in FIG. 1D is intended to be exemplary only. After the electronic components 34 have been attached to the exposed surfaces of the plating layers 20 in a prescribed manner, conductive wires 36 are may be used to electrically connect one or more of the electronic components 34 to one or more of the contacts 28 and/or one or more of the metal features 30. As shown in FIGS. 1D and 1E, a conductive wire 36 may be extended between a pad or terminal of an electronic component 34 and the exposed surface of the plating layer 20 of one of the metal features 30 or one of the contacts 28. In this regard, the conductive wires 36 may be used to achieve any desired pattern of electrical communication between the electronic components 34, the metal features 30 and the contacts 28. As is also shown in relation to one of the electronic components 34 in FIGS. 1D and 1E, a flip chip attachment technique may be used in addition or as an alternative the above-described wire bonding technique.

Figure 2:
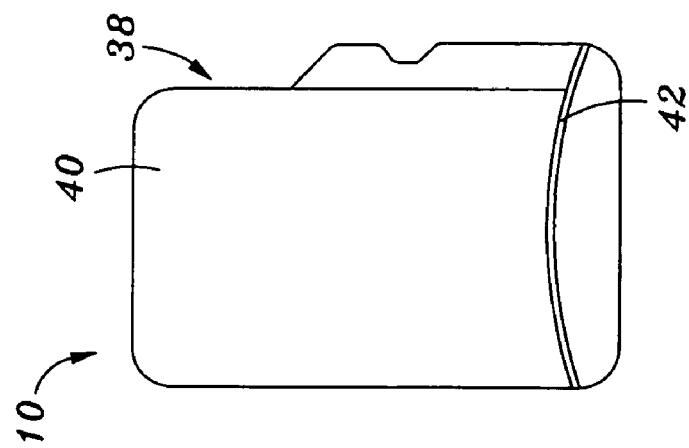
FIG. 2 is a top plan view of a memory card manufactured in accordance with the process steps shown in FIGS. 1A-1E.

Referring now to FIG. 1E, upon the completion of the wire bonding and/or flip chip attachment process described above in relation to FIG. 1D, a molding process is completed wherein an encapsulation part or body 38 formed on the substrate 32. More particularly, the body 38 covers the electronic components 34 and the conductive wires 36. The body 38 also covers the exposed surfaces of the contacts 28 and metal features 30, including the exposed surfaces of the plating layers 20 disposed thereon. In this regard, the body 38, which also contacts the tape layer 24, does not cover those surfaces of the plating layers 20 of the contacts 28 and metal features 30 which are adhered to and thus covered by the tape layer 24. The body 38 includes a top surface 40 which, as shown in FIGS. 1E, 2 and 4, defines regions of two separate elevations due to the inclusion of a sloped portion 42 within the top surface 40. The inclusion of the sloped portion 42 within the top surface 40 effectively creates a finger grip which may be used to assist in the removal of the completed memory card 10 from within a host socket. The body 38 further defines a generally planar bottom surface 44 which is exposed when the body is removed from the tape layer 24. As will be recognized, those surfaces of the plating layers 20 of the contacts 28 and metal features 30 originally adhered to the tape layer 24 are exposed in and substantially flush with the bottom surface 44 of the body 38 when the body 38 separated from the tape layer 24. Those plating layers 20 of the metal features not having an electronic component 34 mounted thereto or a conductive wire 36 extended thereto are still completely covered by and thus embedded within the body 38.

The body 38 also includes multiple side surface portions or sections, many of which extend generally perpendicularly between the top and bottom surfaces 40, 44 thereof. Further, as seen in FIG. 5, the body 38 may further define a chamfer 46 (or rounded/radiused feature) which extends at a prescribed angle or slope between the bottom surface 44 and that side surface section of the body 38 which extends along all of and is disposed closest to the contacts 28. The chamfer 46, if included, is sized and configured to maximize the level of interference between the body 38 of the memory card 10 and the connector pins of a host socket when the memory card 10 is advanced thereinto. In this regard, such connector pins pass over little if any of the body 38 prior to being placed into electrical communication with the contacts 28 upon the advancement of the memory card 10 into the host socket since the chamfer 46, if included, extends along the entirety of the leading edge of the memory card 10.

Figure 3:
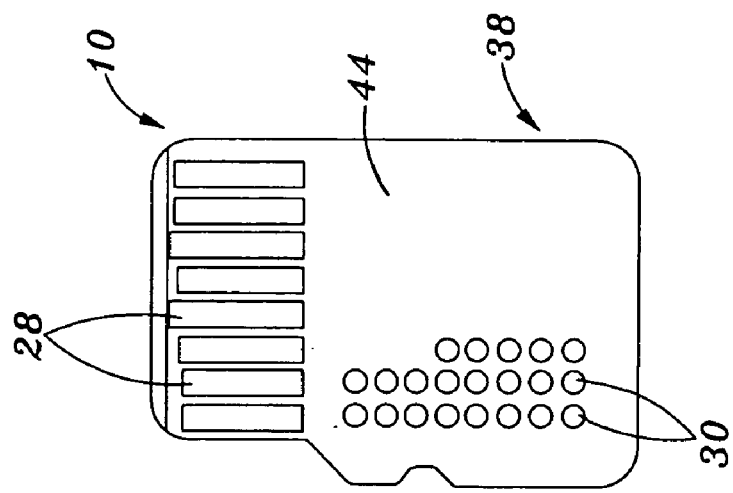
FIG. 3 is a bottom plan view of the memory card shown in FIG. 2.

As indicated above, the contacts 28 and metal features 30, and in particular respective ones of the plating layers 20 applied thereto, are exposed in and substantially flush with the bottom surface 44 of the body 38 when the body 38 is removed from the tape layer 24. A top plan view of the memory card 10 subsequent to the removal of the body 38 from the tape layer 24 is shown in FIG. 2, with a bottom plan view of the memory card 10 being shown in FIG. 3. In FIG. 3, the exposed portions of the metal features 30, which typically function as test points, are clearly depicted. Upon its removal from the tape layer 24, the memory card 10 may be subjected to a suitable testing process through the use of those test points defined by the exposed metal features 30. However, upon the completion of the testing process, it is contemplated that a cover 48 such as a non-conductive label or non-conductive ink will be applied to the bottom surface 44 of the body 38 in a manner effectively covering the exposed metal features 30. In this regard, it is desirable that in the completed memory card 10, no metal features other than for the contacts 28 are exposed in the body 38 thereof.

A bottom plan view of the memory card 10 as including the cover 48 applied to a prescribed area of the bottom surface 44 is shown in FIG. 4. Additionally, a cross-sectional view of the completed memory card 10 having the cover 48 applied to the body 38 is shown in FIG. 5. Importantly, no portions of the exposed surfaces of the contacts 28 are overlapped or covered by the cover 48. Though it is contemplated that the memory card 10 will have the format of a secure digital card, those of ordinary skill in the art will recognize that the process steps described above may be employed to facilitate the fabrication of memory cards in alternative formats (e.g., multi-media cards).

It is contemplated that as a variation to the manufacturing methodology shown and described above, the substrate 32 may be formed in a manner wherein plating layers 20 are included only on the top surfaces of the contacts 28 and metal features 30, with the bottom surfaces thereof being adhered directly to the tape layer 24. In this regard, in the depiction of FIG. 1C, those plating layers 20 shown as being directly engaged to the tape layer 24 would be eliminated, with the bottom surfaces of the contacts 28 and metal features 30 being directly adhered to the tape layer 24 as indicated above. Along these lines, the step of applying the plating mask 18 to the second surface 16 of the sheet 12 would also be eliminated in this alternative process. If such alternative process is implemented, the bottom surfaces of the contacts 28 and metal features 30 would be exposed in and substantially flush with the bottom surface 44 of the body 38, rather than the plating layers 20 applied to such bottom surfaces being exposed in and substantially flush with the bottom surface 44. In this case, it is contemplated that upon the separation of the body 38 from the tape layer 24, a plating process may be completed in a manner wherein plating layers are applied solely to the exposed bottom surfaces of respective ones of the contacts 28.

Advantageously, the memory card 10 constructed in accordance with the present invention possesses the most desirable attributes of both laminate based, lidded memory cards and leadframe based, molded memory cards. In this regard, the memory card 10 does not have any exposed tie bars which are typical artifacts of traditional leadframe based memory cards. The molding process used in the fabrication of the memory card 10 also effectively eliminates the need for the separate cap or lid of prior art memory cards, and provides the memory card 10 with the desirable look of a lidded memory card. Further, the land grid array substrate 32 of the memory card 10, due to its manner of fabrication, provides signal routing capabilities similar to that of the laminate substrate of a conventional memory card, while still providing various cost and manufacturing economies.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card, comprising:
   a substrate having a plurality of contacts and a plurality of metal features, the contacts and the metal features being disposed in spaced relation to each other and each defining opposed first and second surfaces;
   at least one electronic component mounted to the first surface of at least one of the metal features and electrically connected to the substrate; and a body covering the electronic component and at least portions of the contacts and the metal features such that the second surfaces of the contacts and the metal features are exposed in a bottom surface of the body.

2. The memory card of claim 1 wherein the first and second surfaces of the contacts and the metal features each include a plating layer disposed thereon, the plating layer disposed on the second surface of each of the contacts and on the second surface of each of the metal features being exposed in the bottom surface of the body.

3. The memory card of claim 1 wherein the electronic component is mounted to the first surfaces of a plurality of the metal features.

4. The memory card of claim 3 wherein the electronic component is mounted to the first surface of at least one of the contacts.

5. The memory card of claim 1 wherein the electronic component is electrically connected to at least one of the contacts and at least one of the metal features.

6. The memory card of claim 1 wherein multiple electronic components are mounted to the first surfaces of at least some of the metal features, each of the electronic components being electrically connected to the substrate.

7. The memory card of claim 6 wherein the electronic components are selected from the group consisting of:
a semiconductor package;
a semiconductor die;
a passive component; and
combinations thereof.

8. The memory card of claim 6 wherein at least one of the electronic components is electrically connected to at least one of the contacts and the metal features by a conductive wire which is covered by the body.

9. The memory card of claim 8 wherein at least one of the electronic components is electrically connected to at least one of the metal features through a flip chip connection.

10. The memory card of claim 6 wherein at least two of the electronic components are arranged in a stacked configuration as a stacked pair, with a lower electronic component of the stacked pair being mounted to the first surface of at least one of the metal features, and an upper electronic component of the stacked pair being mounted to the lower electronic component.

11. The memory card of claim 1 wherein the metal features are selected from the group consisting of:
die pads;
test points;
conductive traces; and
combinations thereof.

12. The memory card of claim 1 wherein the body defines multiple side surface sections and a chamfer which extends along and in close proximity to the contacts between the bottom surface and one of the side surface sections.

13. The memory card of claim 1 wherein the body defines a top surface having a sloped portion formed therein which is sized and configured to create a finger grip.

14. The memory card of claim 1 wherein the second surfaces of the contacts and the second surfaces of the metal features extend in generally coplanar relation to each other.

15. The memory card of claim 1 wherein the first surfaces of the contacts and the first surfaces of the metal features extend in generally coplanar relation to each other.

16. The memory card of claim 1 further comprising a cover applied to the bottom surface of the body in a manner covering the exposed second surfaces of the metal features.

17. The memory card of claim 16 wherein the cover is selected from the group consisting of:
a non-conductive label; and
a layer of non-conductive ink.

18. The memory card of claim 1 wherein the memory card is a secure digital card.

19. A memory card, comprising:
a substrate having a plurality of contacts and a plurality of metal features, the contacts and the metal features being disposed in spaced relation to each other and each defining opposed first and second surfaces;
a plurality of electronic components mounted to the substrate and electrically connected to at least some of the contacts and the metal features thereof;
a body covering the electronic components and at least portions of the contacts and the metal features such that the second surfaces of the contacts and the metal features are exposed in a bottom surface of the body; and
a cover disposed on the bottom surface of the body in a manner covering the exposed second surfaces of the metal features.

20. A memory card, comprising:
a substrate having a plurality of contacts and a plurality of metal features, the contacts and the metal features being disposed in spaced relation to each other;
at least one electronic component mounted to the substrate and electrically connected to at least one of the contacts and at least one of the metal features thereof; and
a body covering the electronic component and at least portions of the contacts and the metal features such that a surface of each the contacts and each of the metal features is exposed in a common exterior surface of the body.

* * * * *